(12) United States Patent
Xu

(10) Patent No.: US 12,119,274 B2
(45) Date of Patent: Oct. 15, 2024

(54) LATCH-UP TEST STRUCTURE

(71) Applicant: CHANGXIN MEMORY TECHNOLOGIES, INC., Hefei (CN)

(72) Inventor: Qian Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 47 days.

(21) Appl. No.: 17/656,727

(22) Filed: Mar. 28, 2022

(65) Prior Publication Data

US 2023/0041116 A1 Feb. 9, 2023

(30) Foreign Application Priority Data

Aug. 6, 2021 (CN) .......................... 202110903890.7

(51) Int. Cl.
*H01L 21/66* (2006.01)
*G01R 31/28* (2006.01)
*H01L 27/082* (2006.01)
*H01L 27/092* (2006.01)
*H01L 29/06* (2006.01)
*H01L 29/73* (2006.01)

(52) U.S. Cl.
CPC .......... *H01L 22/30* (2013.01); *G01R 31/2856* (2013.01); *H01L 27/082* (2013.01); *H01L 29/0626* (2013.01); *H01L 29/7313* (2013.01); *H01L 27/0921* (2013.01)

(58) Field of Classification Search
CPC ..... H01L 22/30; H01L 22/14; H01L 27/0921; H01L 22/34; G01R 31/2856
See application file for complete search history.

(56) References Cited

U.S. PATENT DOCUMENTS

2007/0007545 A1* 1/2007 Salcedo .............. H01L 27/0262
257/127
2016/0141287 A1 5/2016 He et al.

FOREIGN PATENT DOCUMENTS

CN 102903713 A 1/2013
TW 201618272 A 5/2016

OTHER PUBLICATIONS

TW Office Action cited in TW11112962, mailed Apr. 11, 2023, 7 pages.

* cited by examiner

*Primary Examiner* — Yara B Green
*Assistant Examiner* — Fakeha Sehar
(74) *Attorney, Agent, or Firm* — Syncoda LLC; Feng Ma

(57) ABSTRACT

The present disclosure provides a latch-up test structure, including: a substrate of a first conductive type; a first well region of the first conductive type, located in the substrate of the first conductive type; a first doped region of the first conductive type, located in the first well region of the first conductive type; a first doped region of a second conductive type, located in the first well region of the first conductive type; and a second doped region of the first conductive type, a second doped region of the second conductive type, a third doped region of the first conductive type, and a third doped region of the second conductive type that are arranged at intervals in the substrate of the first conductive type.

4 Claims, 6 Drawing Sheets

LATCH-UP TEST STRUCTURE

CROSS-REFERENCE TO RELATED APPLICATIONS

This application claims the priority of Chinese Patent Application No. 202110903890.7, submitted to the Chinese Intellectual Property Office on Aug. 6, 2021, the disclosure of which is incorporated herein in its entirety by reference.

TECHNICAL FIELD

The present disclosure relates to the field of semiconductor integrated circuit manufacturing, and in particular, to a latch-up test structure.

BACKGROUND

A latch-up effect is a self-destructive phenomenon in which an avalanche current amplification effect is caused by a positive feedback formed by interaction between a parasitic PNP Bi-polar Junction transistor (BJT) and NPN BJT of a Complementary Metal Oxide Semiconductor (CMOS) due to a pulse current or voltage fluctuation. The latch-up effect creates a low-impedance path between a power supply terminal Vdd and a ground terminal Vss, allowing a high current to flow between parasitic circuits, causing the circuits to stop normal operation or even self-destruct.

With the development of the integrated circuit manufacturing process, the chip package density and integration become higher, and a latch up is thus more likely to occur. Therefore, it is very important to evaluate the latch-up effect in semiconductor devices to test the reliability of semiconductor products. However, due to various possible latch-up paths in semiconductor devices, it is difficult to evaluate the latch-up effect in semiconductor structures efficiently and comprehensively.

SUMMARY

The present disclosure provides a latch-up test structure, including: a substrate of a first conductive type; a first well region of the first conductive type, located in the substrate of the first conductive type; a first doped region of the first conductive type, located in the first well region of the first conductive type; a first doped region of a second conductive type, located in the first well region of the first conductive type, and spaced apart from the first doped region of the first conductive type; a second doped region of the first conductive type, a second doped region of the second conductive type, a third doped region of the first conductive type, and a third doped region of the second conductive type that are arranged at intervals in the substrate of the first conductive type; where the second doped region of the first conductive type, the second doped region of the second conductive type, the third doped region of the first conductive type, and the third doped region of the second conductive type are located at a side, which is away from the first doped region of the first conductive type, of the first doped region of the second conductive type, and are each spaced apart from the first well region of the first conductive type.

DETAILED DESCRIPTION

Figure 1:
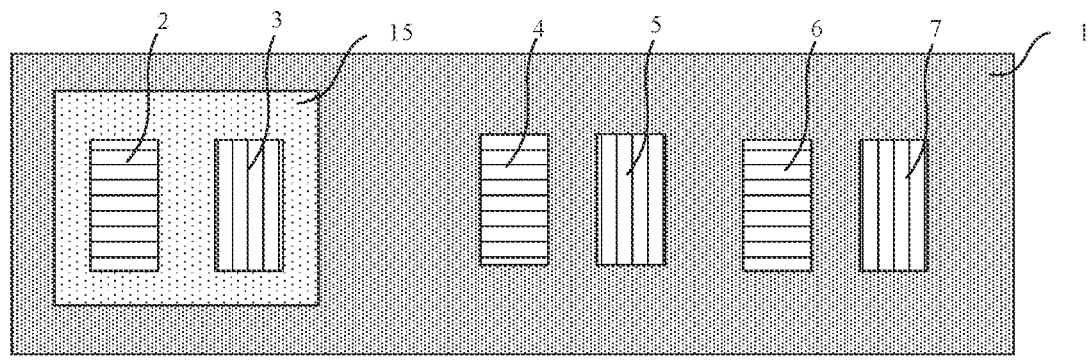
FIG. 1 is a top view of a latch-up test structure according to an embodiment of the present disclosure.

In order to facilitate the understanding of the present disclosure, the present disclosure is described more completely below with reference to the accompanying drawings. Preferred embodiments of the represent disclosure are shown in the drawings. However, the present disclosure is embodied in various forms without being limited to the embodiments set forth herein. On the contrary, these embodiments are provided to make the present disclosure more thoroughly and comprehensively understood.

Unless otherwise defined, all technical and scientific terms used herein have the same meaning as commonly understood by those skilled in the technical field of the present invention.

The terms mentioned herein are merely for the purpose of describing specific embodiments, rather than to limit the present disclosure. The term "and/or" used herein includes any and all combinations of one or more of the associated listed items.

In the description of a position relationship, unless otherwise specified, when one element, e.g., a layer, film, or substrate, is referred to as being "on" another film layer, it can be directly located on the other film layer or there may be an intermediate film layer. Further, when a layer is referred to as being "under" another layer, it can be directly under the other layer, or there may be one or more intermediate layers. It can also be understood that, when a layer is referred to as being "between" two layers, it may be the only layer between the two layers, or other may be one or more intermediate layers.

In a case that terms "include", "have", and "contain" in the specification are used, unless clear qualifiers such as "only" and "consist of" are used, another component can be added. Unless the contrary is mentioned, terms in the singular form may include the plural form but are not to be understood as a single one.

There are two test modes for testing a latch-up effect of a semiconductor device: a positive current mode (PI mode) and a negative current mode (NI mode). The present disclosure focuses on the design of a latch-up test structure in the NI mode.

Figure 2:
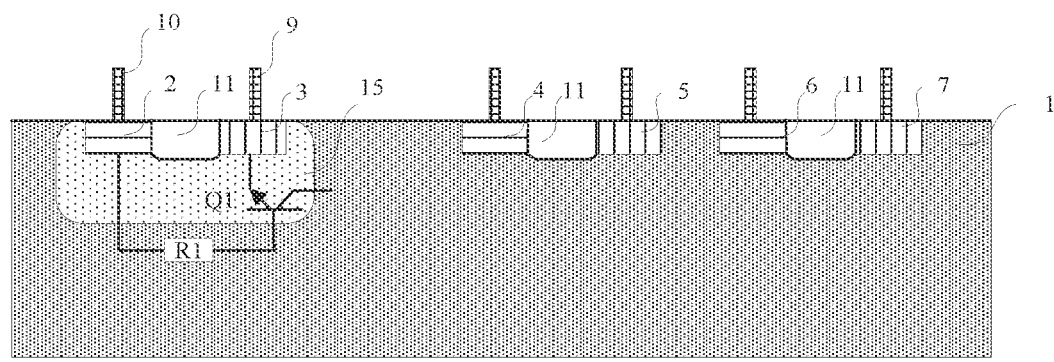
FIG. 2 is a schematic cross-sectional structural diagram of the latch-up test structure in FIG. 1.

As shown in FIG. 1 and FIG. 2, an embodiment of the present disclosure provides a latch-up test structure, including: a substrate 1 of a first conductive type; a first well region 15 of the first conductive type, located in the substrate 1 of the first conductive type; a first doped region 2 of the first conductive type, located in the first well region 15 of the first conductive type; a first doped region 3 of a second conductive type, located in the first well region 15 of the first conductive type, and spaced apart from the first doped region 2 of the first conductive type; a second doped region 4 of the first conductive type, a second doped region 5 of the second conductive type, a third doped region 6 of the first conductive type, and a third doped region 7 of the second conductive type that are arranged at intervals in the substrate 1 of the first conductive type, where the second doped region 4 of the first conductive type, the second doped region 5 of the second conductive type, the third doped region 6 of the first conductive type, and the third doped region 7 of the second conductive type are located at a side, which is away from the first doped region 2 of the first conductive type, of the first doped region 3 of the second conductive type, and are each spaced apart from the first well region 15 of the first conductive type.

Specifically, in this embodiment, the first conductive type may be a P type, and the second conductive type may be an N type. In other embodiments, the first conductive type may be an N, and the second conductive type may be a P type.

The first doped region 3 of the second conductive type and the first doped region 2 of the first conductive type are both located in the first well region 15 of the first conductive type, and an STI structure 11 is arranged between the first doped region 3 of the second conductive type and the first doped region 2 of the first conductive type, as shown in FIG. 2. For example, the first well region 15 of the first conductive type is a lightly doped region, and the first doped region 3 of the second conductive type and the first doped region 2 of the first conductive type are heavily doped regions. The first well region 15 of the first conductive type has a depth of 0.3 μm to 0.5 μm, for example, 0.3 μm, 0.4 μm, or 0.5 μm. The STI structure 11 has a depth of less than 0.3 μm.

Further referring to FIG. 2, an STI structure 11 is arranged between the second doped region 4 of the first conductive type and the second doped region 5 of the second conductive type, and an STI structure 11 is arranged between the third doped region 6 of the first conductive type and the third doped region 7 of the second conductive type. For example, the second doped region 4 of the first conductive type, the second doped region 5 of the second conductive type, the third doped region 6 of the first conductive type, and the third doped region 7 of the second conductive type are all heavily doped regions, and the depths of the STI structures 11 are all less than 0.3 μm. In addition, all the doped regions are provided with electrodes on upper surfaces. A first electrode 9 is provided on the upper surface of the first doped region 3 of the second conductive type, and a second electrode 10 is provided on the first doped region 2 of the first conductive type.

Figure 3:
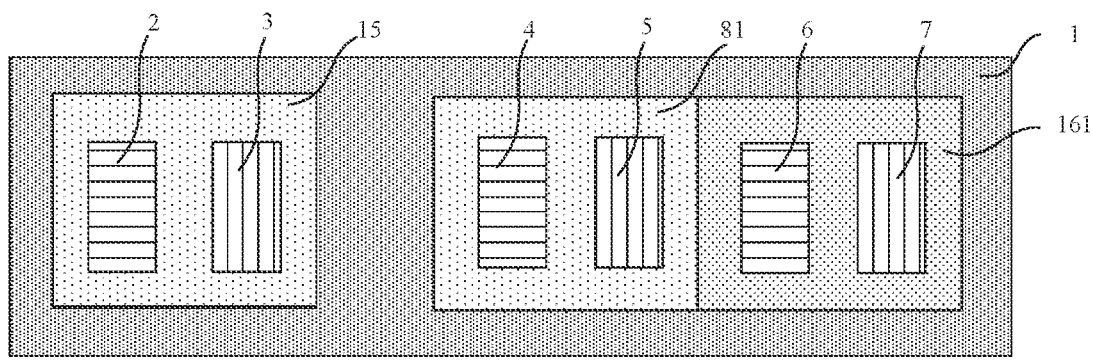
FIG. 3 is a top view of a latch-up test structure according to another embodiment of the present disclosure.
Figure 4:
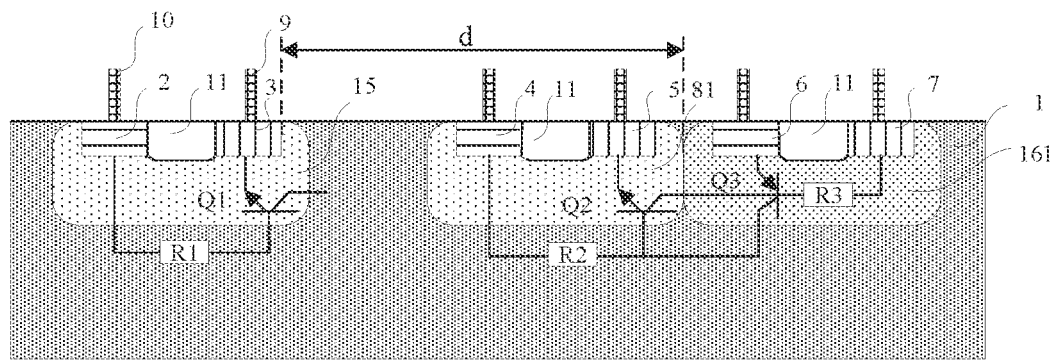
FIG. 4 is a schematic cross-sectional structural diagram of the latch-up test structure in FIG. 3.

In an embodiment, as shown in FIG. 3 and FIG. 4, the latch-up test structure further includes: a second well region 81 of the first conductive type, located in the substrate 1 of the first conductive type and spaced apart from the first well region 15 of the first conductive type, where the second doped region 4 of the first conductive type and the second doped region 5 of the second conductive type are located in the second well region 81 of the first conductive type, and the second doped region 4 of the first conductive type is located between the second doped region 5 of the second conductive type and the first well region 15 of the first conductive type; and a well region 161 of the second conductive type, located in the substrate 1 of the first conductive type and at a side, which is away from the first well region 15 of the first conductive type, of the second well region 81 of the first conductive type, and being adjacent to the second well region 81 of the first conductive type, where the third doped region 6 of the first conductive type and the third doped region 7 of the second conductive type are both located in the well region 161 of the second conductive type, and the third doped region 6 of the first conductive type is located between the third doped region 7 of the second conductive type and the second doped region 5 of the second conductive type.

For example, the second well region 81 of the first conductive type and the well region 161 of the second conductive type are both lightly doped regions; depths of the second well region 81 of the first conductive type and the well region 161 of the second conductive type may be 0.3 μm to 0.5 μm, for example, 0.3 μm, 0.4 μm, or 0.5 μm.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 4. The first doped region 3 of the second conductive type, the first well region 15 of the first conductive type, and the well region 161 of the second conductive type jointly form a first BJT Q1; the second doped region 5 of the second conductive type, the second well region 81 of the first conductive type, and the well region 161 of the second conductive type jointly form a second BJT Q2; the third doped region 6 of the first conductive type, the well region 161 of the second conductive type, and the substrate 1 of the first conductive type jointly form a third BJT Q3. A first resistance R1 is an equivalent resistance of the first well region 15 of the first conductive type, a second resistance R2 is an equivalent resistance of the second well region 81 of the first conductive type, and a third resistance R3 is an equivalent resistance of the well region 161 of the second conductive type.

Parasitic NPN and/or PNP BJTs are formed in the latch-up test structure, which will cause a latch-up when an external voltage meets a certain condition, thus generating a latch-up effect. When the latch-up test structure is used for testing latch-up characteristics in the NI mode, the first electrode 9 may be connected to a common ground terminal VSS, and currents of different values are outputted from the latch-up test structure to the outside through the second electrode 10. For example, the current value may be 1 μA, 10 μA, 100 μA, or 1 mA. Then, the latch-up test structure is tested by using a Transmission Line Pulse (TLP), to obtain electrical parameters corresponding to latch-up characteristics of the current structure. The electrical parameters corresponding to the latch-up characteristics refer to a trigger voltage, a holding voltage, a trigger current, and a holding current of the latch-up test structure that are obtained according to an IV hysteresis characteristics curve of the latch-up test structure, where the hysteresis characteristics curve is obtained by testing with the TLP. With a higher trigger voltage, a latch-up effect is less likely to occur, and with a higher holding voltage, it is more difficult to maintain the latch-up effect. Assuming that a normal operating voltage is 1.1V, a trigger voltage of 1.2V corresponds to a higher risk of causing a latch-up effect, and a trigger voltage of 2V corresponds to a lower risk of causing a latch-up effect. Similarly, the same principle applies to the holding voltage. It should be noted that, the holding voltage is generally less than the trigger voltage.

In addition, the electrical parameters corresponding to the latch-up test structure may further be tested by adjusting the value of d (as shown in FIG. 4, d is the distance between the first doped region 3 of the second conductive type and the well region 161 of the second conductive type), to avoid a latch-up effect in an integrated circuit having the latch-up test structure. Specifically, when the value of d decreases, external noise received by the latch-up test structure increases, and the holding voltage decreases. Therefore, a latch-up easier is more likely to occur. For example, when an output current of the latch-up test structure is 100 μA, a latch-up occurs if d is less than 50 nm. Therefore, during integrated circuit design, a design rule (DR) for d in the integrated circuit having the latch-up test structure requires d to be greater than 50 nm, to avoid a latch-up.

Figure 5:
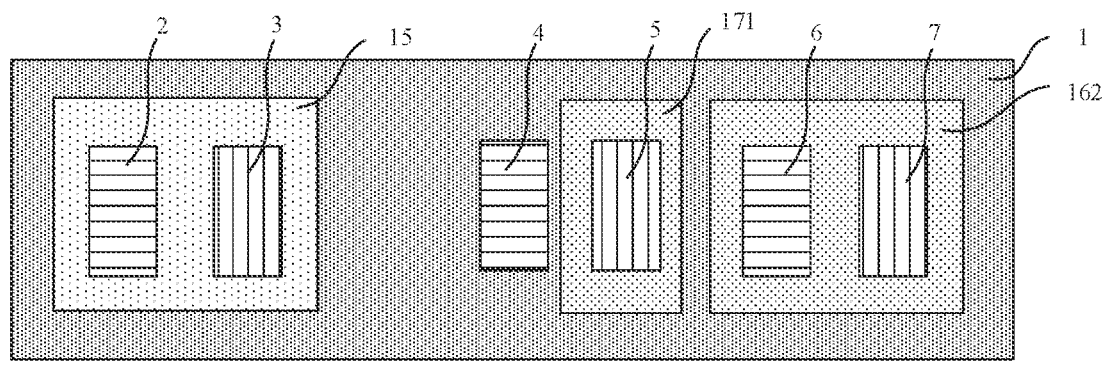
FIG. 5 is a top view of a latch-up test structure according to still another embodiment of the present disclosure.

In the foregoing latch-up test structure, well regions and doped regions of different doping types are designed in the substrate 1 of the first conductive type, which can trigger a latch-up under certain external conditions. By testing related electrical parameters of the various possible latch-up structures in the integrated circuit and extracting rule parameters corresponding to various structures, design of the integrated circuit can be implemented and improved, to better ensure product reliability. In an embodiment, based on the embodiment shown in FIG. 1 and FIG. 2, as shown in FIG. 5 and FIG. 6, the latch-up test structure further includes: a first well region 162 of the second conductive type, located in the substrate 1 of the first conductive type, where the third doped region 6 of the first conductive type and the third doped region 7 of the second conductive type are both located in the first well region 162 of the second conductive type, and the third doped region 6 of the first conductive type is located between the third doped region 7 of the second conductive type and the first well region 15 of the first conductive type; the second doped region 4 of the first conductive type is located between the first well region 162 of the second conductive type and the first well region 15 of the first conductive type, and are spaced apart from the first well region 162 of the second conductive type and the first well region 15 of the first conductive type; and a second well region 171 of the second conductive type, located in the substrate 1 of the first conductive type and between the first well region 162 of the second conductive type and the second doped region 4 of the first conductive type, and spaced apart from the first well region 162 of the second conductive type and the second doped region 4 of the first conductive type, where the second doped region 5 of the second conductive type is located in the second well region 171 of the second conductive type.

Figure 6:
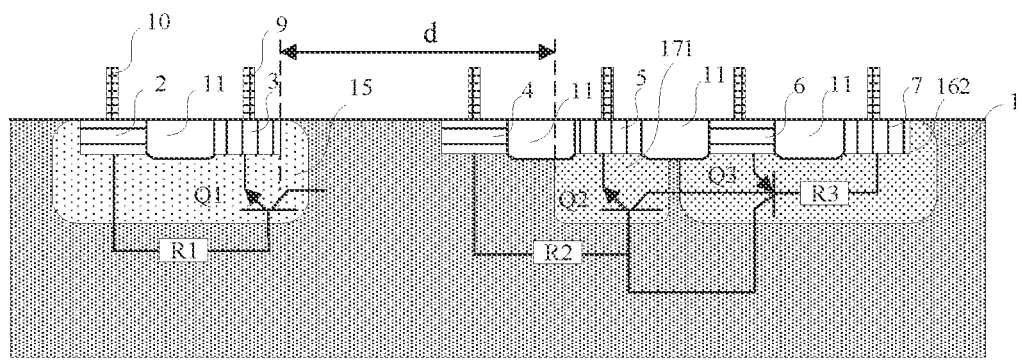
FIG. 6 is a schematic cross-sectional structural diagram of the latch-up test structure in FIG. 5.

Further, referring to FIG. 6, the first well region 15 of the first conductive type, the first well region 162 of the second conductive type, and the second well region 171 of the second conductive type are all lightly doped regions. Depths of the first well region 15 of the first conductive type, the first well region 162 of the second conductive type, and the second well region 171 of the second conductive type may be 0.3 μm to 0.5 μm, for example, 0.3 μm, 0.4 μm or 0.5 μm. An STI structure 11 is located between the second doped region 5 of the second conductive type and the third doped region 6 of the first conductive type. The STI structure 11 has a depth of less than 0.3 μm. d is a distance between the first doped region 3 of the second conductive type and the second well region 171 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 6. The first doped region 3 of the second conductive type, the first well region 15 of the first conductive type, and the second well region 171 of the second conductive type jointly form a first BJT Q1; the second well region 171 of the second conductive type, the substrate 1 of the first conductive type, and the first well region 162 of the second conductive type jointly form a second BJT Q2; the third doped region 6 of the first conductive type, the first well region 162 of the second conductive type, and the substrate 1 of the first conductive type jointly form a third BJT Q3. A first resistance R1 is an equivalent resistance of the first well region 15 of the first conductive type, a second resistance R2 is an equivalent resistance of the substrate 1 of the first conductive type, and a third resistance R3 is an equivalent resistance of the first well region 162 of the second conductive type.

Figure 7:
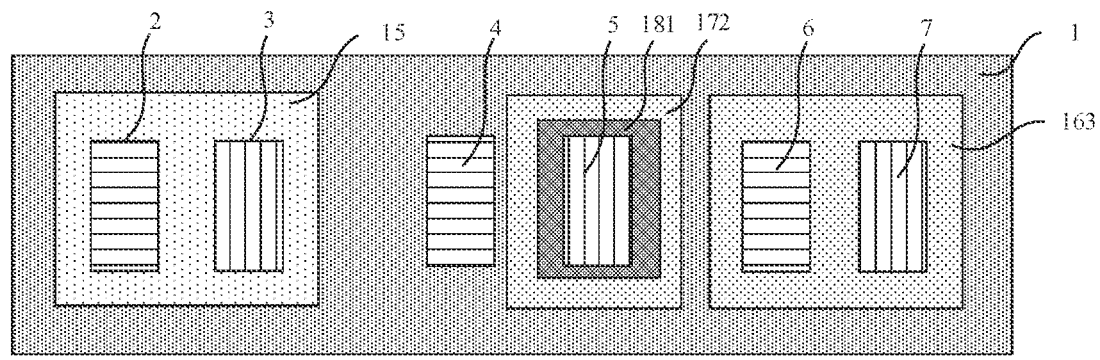
FIG. 7 is a top view of a latch-up test structure according to still another embodiment of the present disclosure.
Figure 8:
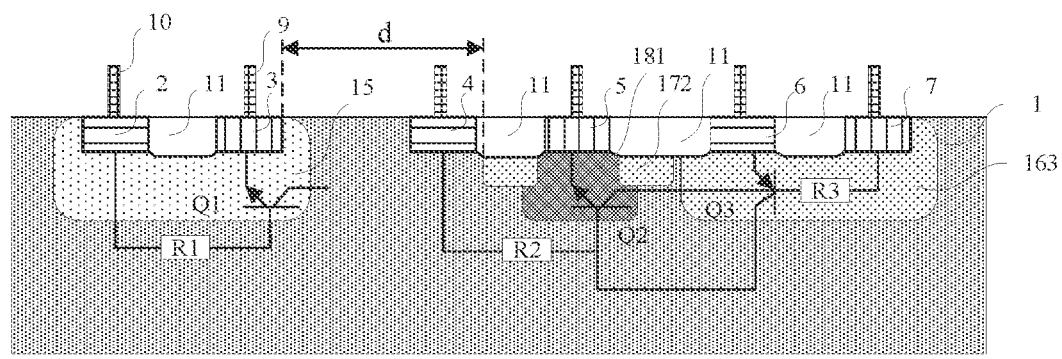
FIG. 8 is a schematic cross-sectional structural diagram of the latch-up test structure in FIG. 7.

In an embodiment, based on the embodiment shown in FIG. 1 and FIG. 2, as shown in FIG. 7 and FIG. 8, the latch-up test structure further includes: a first well region 163 of the second conductive type, located in the substrate 1 of the first conductive type, where the third doped region 6 of the first conductive type and the third doped region 7 of the second conductive type are both located in the first well region 163 of the second conductive type, and the third doped region 6 of the first conductive type is located between the third doped region 7 of the second conductive type and the first well region 15 of the first conductive type; the second doped region 4 of the first conductive type is located between the first well region 163 of the second conductive type and the first well region 15 of the first conductive type, and is spaced apart from the first well region 163 of the second conductive type and the first well region 15 of the first conductive type; a deep well region 181 of the second conductive type, located in the substrate 1 of the first conductive type and between the first well region 163 of the second conductive type and the second doped region 4 of the first conductive type, and spaced apart from the first well region 163 of the second conductive type and the second doped region 4 of the first conductive type, where the second doped region 5 of the second conductive type is located in the deep well region 181 of the second conductive type; and a second well region 172 of the second conductive type, located on a periphery of the deep well region 181 of the second conductive type, and spaced apart from the first well region 163 of the second conductive type and the second doped region 4 of the first conductive type.

Further, the first well region 15 of the first conductive type, the first well region 163 of the second conductive type, the second well region 172 of the second conductive type, and the deep well region 181 of the second conductive type are all lightly doped regions. Depths of the first well region 15 of the first conductive type, the first well region 163 of the second conductive type, and the second well region 172 of the second conductive type may be 0.3 μm to 0.5 μm, for example, 0.3 μm, 0.4 μm or 0.5 μm. Depths of the deep well region 181 of the second conductive type may be 0.5 μm to 1 μm, for example, 0.5 μm, 0.7 μm or 1 μm. As shown in FIG. 8, the second well region 172 of the second conductive type is partially located in the deep well region 181 of the second conductive type. An STI structure 11 is arranged between the second doped region 5 of the second conductive type and the third doped region 6 of the first conductive type, and a depth of the STI structure 11 is less than 0.3 μm. d is a distance between the first doped region 3 of the second conductive type and the second well region 172 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 8. For example, the first doped region 3 of the second conductive type, the first well region 15 of the first conductive type, and the deep well region 181 of the second conductive type jointly form a first BJT Q1; the deep well region 181 of the second conductive type, the substrate 1 of the first conductive type, and the second well region 172 of the second conductive type jointly form a second BJT Q2; the third doped region 6 of the first conductive type, the first well region 163 of the second conductive type, and the substrate 1 of the first conductive type jointly form a third BJT Q3. A first resistance R1 is an equivalent resistance of the first well region 15 of the first conductive type, a second resistance R2 is an equivalent resistance of the substrate 1 of the first conductive type, and a third resistance R3 is an equivalent resistance of the first well region 163 of the second conductive type.

Figure 9:
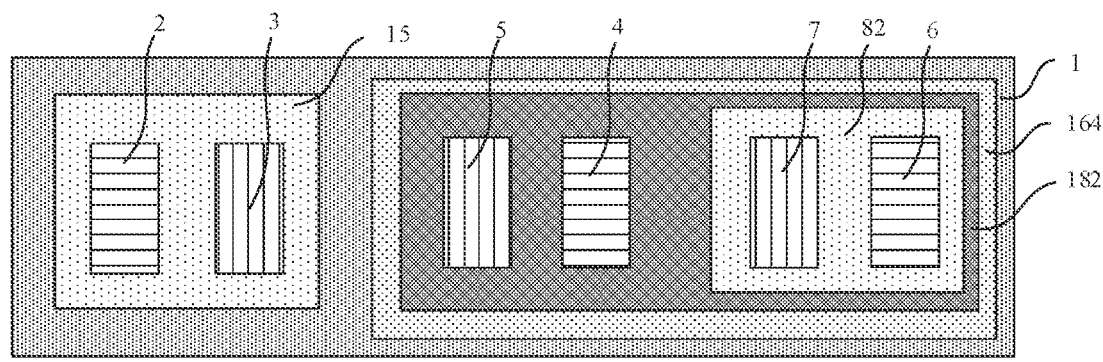
FIG. 9 is a top view of a latch-up test structure according to still another embodiment of the present disclosure.
Figure 10:
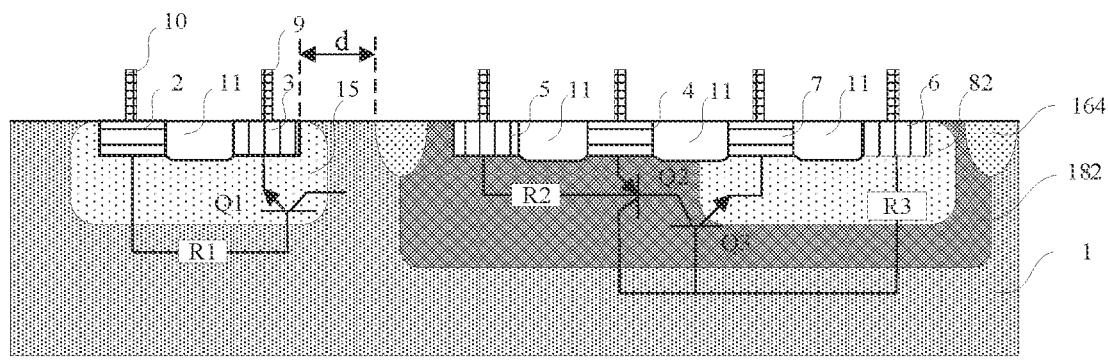
FIG. 10 is a schematic cross-sectional structural diagram of the latch-up test structure in FIG. 9.

In an embodiment, based on the embodiment shown in FIG. 1 and FIG. 2, as shown in FIG. 9 and FIG. 10, the latch-up test structure further includes: a deep well region 182 of the second conductive type, located in the substrate 1 of the first conductive type and spaced apart from the first well region 15 of the first conductive type, where the second doped region 5 of the second conductive type and the second doped region 4 of the first conductive type are both located in the deep well region 182 of the second conductive type, and the second doped region 5 of the second conductive type is located between the second doped region 4 of the first conductive type and the first well region 15 of the first conductive type; a second well region 82 of the first conductive type, located in the deep well region 182 of the second conductive type and at a side, which is away from the second doped region 5 of the second conductive type, of the second doped region 4 of the first conductive type, and spaced apart from the second doped region 4 of the first conductive type, where the third doped region 6 of the first conductive type and the third doped region 7 of the second conductive type are both located in the second well region 82 of the first conductive type, and the third doped region 7 of the second conductive type is located between the third doped region 6 of the first conductive type and the second doped region of the first conductive type; and a well region 164 of the second conductive type, located on a periphery of the deep well region 182 of the second conductive type, and spaced apart from the first well region 15 of the first conductive type.

The well region 164 of the second conductive type is partially located in the deep well region 182 of the second conductive type. Further, the first well region 15 of the first conductive type, the well region 164 of the second conductive type, the second well region 82 of the first conductive type, and the deep well region 182 of the second conductive type are all lightly doped regions. Depths of the first well region 15 of the first conductive type, the well region 164 of the second conductive type, and the second well region 82 of the first conductive type may be 0.3 μm to 0.5 μm, for example, 0.3 μm, 0.4 μm or 0.5 μm. Depths of the deep well region 182 of the second conductive type may be 0.5 μm to 1 μm, for example, 0.5 μm, 0.7 μm or 1 μm. An STI structure 11 is arranged between the second doped region 4 of the first conductive type and the third doped region 7 of the second conductive type, and a depth of the STI structure 11 is less than 0.3 μm. d is a distance between the first doped region 3 of the second conductive type and the well region 164 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 10. For example, the first doped region 3 of the second conductive type, the first well region 15 of the first conductive type, and the deep well region 182 of the second conductive type jointly form a first BJT Q1; the second doped region 4 of the first conductive type, the deep well region 182 of the second conductive type, and the substrate 1 of the first conductive type jointly form a second BJT Q2; the deep well region 182 of the second conductive type, the second well region 82 of the first conductive type, and the third doped region 7 of the second conductive type jointly form a third BJT Q3. A first resistance R1 is an equivalent resistance of the first well region 15 of the first conductive type, a second resistance R2 is an equivalent resistance of the deep well region 182 of the second conductive type, and a third resistance R3 is an equivalent resistance of the second well region 82 of the first conductive type.

Figure 11:
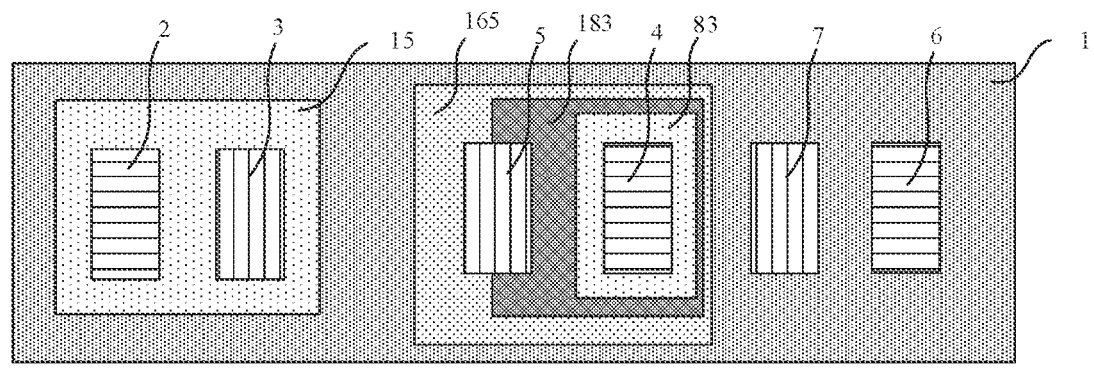
FIG. 11 is a top view of a latch-up test structure according to still another embodiment of the present disclosure.
Figure 12:
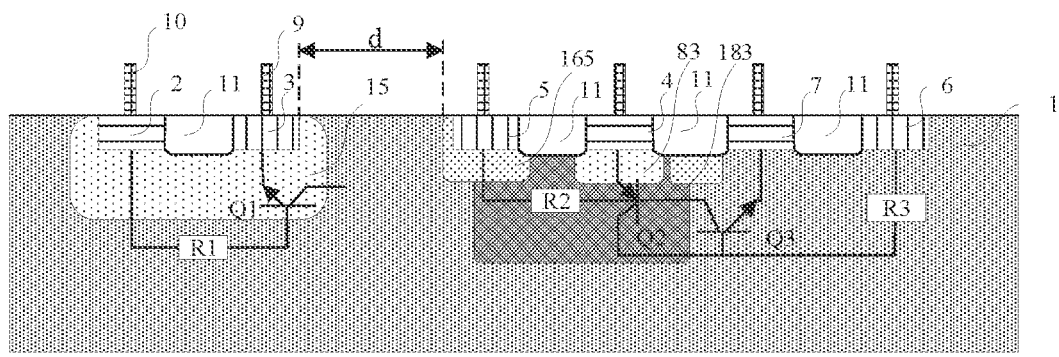
FIG. 12 is a schematic cross-sectional structural diagram of the latch-up test structure in FIG. 11.

In an embodiment, based on the embodiment shown in FIG. 1 and FIG. 2, as shown in FIG. 11 and FIG. 12, the latch-up test structure further includes: a deep well region 183 of the second conductive type, located in the substrate 1 of the first conductive type; a second well region 83 of the first conductive type, located in the deep well region 183 of the second conductive type, where the second doped region 4 of the first conductive type is located in the second well region 83 of the first conductive type; and a well region 165 of the second conductive type, located on a periphery of the deep well region 183 of the second conductive type, where the second doped region 5 of the second conductive type is located in the well region 165 of the second conductive type and between the second well region 83 of the first conductive type and the first well region 15 of the first conductive type; the third doped region 7 of the second conductive type is located at a side, which is away from the first well region 15 of the first conductive type, of the deep well region 183 of the second conductive type, and is spaced apart from the well region 165 of the second conductive type; and the third doped region 6 of the first conductive type is located at a side, which is away from the deep well region 183 of the second conductive type, of the third doped region 7 of the second conductive type.

The well region 165 of the second conductive type is partially located in the deep well region 183 of the second conductive type. Further, the first well region 15 of the first conductive type, the well region 165 of the second conductive type, the deep well region 183 of the second conductive type, and the second well region 83 of the first conductive type are all lightly doped regions. Depths of the first well region 15 of the first conductive type, the well region 165 of the second conductive type, and the second well region 83 of the first conductive type may be 0.3 μm to 0.5 μm, for example, 0.3 μm, 0.4 μm or 0.5 μm. Depths of the deep well region 183 of the second conductive type may be 0.5 μm to 1 μm, for example, 0.5 μm, 0.7 μm or 1 μm. An STI structure 11 is arranged between the second doped region 4 of the first conductive type and the third doped region 7 of the second conductive type, and a depth of the STI structure 11 is less than 0.3 μm. d is a distance between the first doped region 3 of the second conductive type and the well region 165 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 12. For example, the first doped region 3 of the second conductive type, the first well region 15 of the first conductive type, and the deep well region 183 of the second conductive type jointly form a first BJT Q1; the second well region 83 of the first conductive type, the deep well region 183 of the second conductive type, and the substrate 1 of the first conductive type jointly form a second BJT Q2; the deep well region 183 of the second conductive type, the substrate 1 of the first conductive type, and the third doped region 7 of the second conductive type jointly form a third BJT Q3. A first resistance R1 is an equivalent resistance of the first well region 15 of the first conductive type, a second resistance R2 is an equivalent resistance of the deep well region 183 of the second conductive type, and a third resistance R3 is an equivalent resistance of the substrate 1 of the first conductive type.

Figure 13:
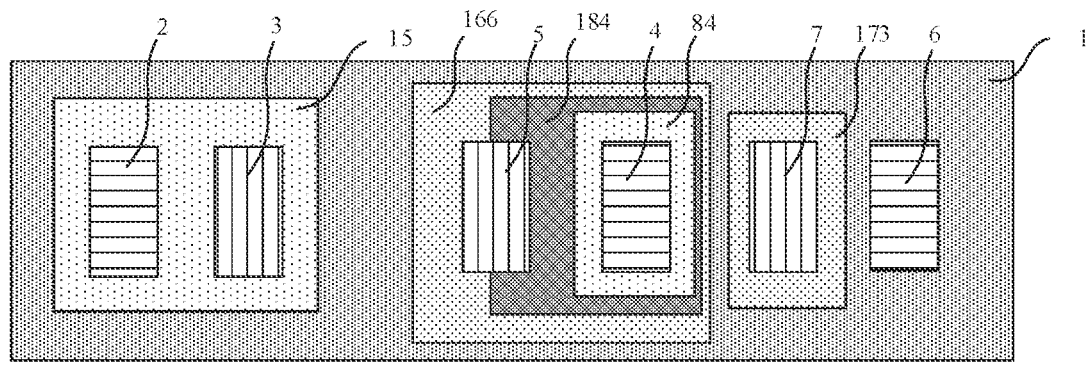
FIG. 13 is a top view of a latch-up test structure according to still another embodiment of the present disclosure.
Figure 14:
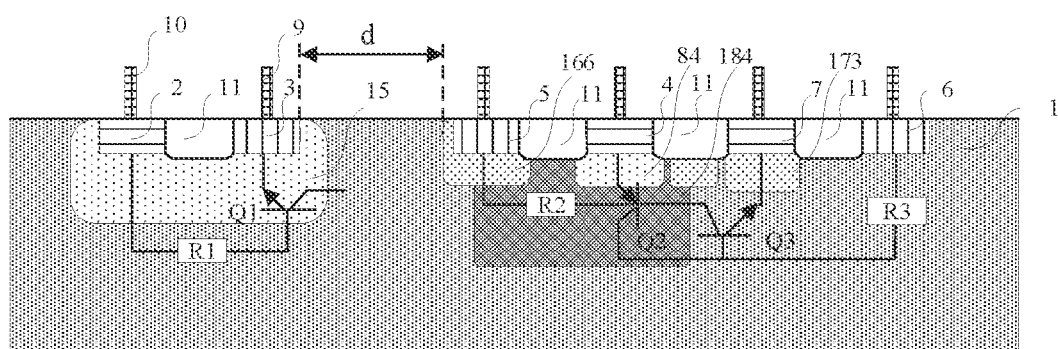
FIG. 14 is a schematic cross-sectional structural diagram of the latch-up test structure in FIG. 13.

In an embodiment, based on the embodiment shown in FIG. 1 and FIG. 2, as shown in FIG. 13 and FIG. 14, the latch-up test structure further includes: a deep well region 184 of the second conductive type, located in the substrate 1 of the first conductive type; a second well region 84 of the first conductive type, located in the deep well region 184 of the second conductive type, where the second doped region 4 of the first conductive type is located in the second well region 84 of the first conductive type; a first well region 166 of the second conductive type, located on a periphery of the deep well region 184 of the second conductive type, where the second doped region 5 of the second conductive type is located in the first well region 166 of the second conductive type and between the second well region 84 of the first conductive type and the first well region 15 of the first conductive type; and a second well region 173 of the second conductive type, located at a side, which is away from the first well region 15 of the first conductive type, of the deep well region 184 of the second conductive type, and spaced apart from the first well region 166 of the second conductive type, where the third doped region 7 of the second conductive type is located in the second well region 173 of the second conductive type; the third doped region 6 of the first conductive type is located at a side, which is away from the deep well region 184 of the second conductive type, of the second well region 173 of the second conductive type, and is spaced apart from the second well region 173 of the second conductive type.

The first well region 166 of the second conductive type is partially located in the deep well region 184 of the second conductive type. Further, the first well region 15 of the first conductive type, the first well region 166 of the second conductive type, the second well region 173 of the second conductive type, the second well region 84 of the first conductive type, and the deep well region 184 of the second conductive type are all lightly doped regions. Depths of the first well region 15 of the first conductive type, the first well region 166 of the second conductive type, the second well region 173 of the second conductive type, and the second well region 84 of the first conductive type may be 0.3 μm to 0.5 μm, for example, 0.3 μm, 0.4 μm or 0.5 μm. Depths of the deep well region 184 of the second conductive type may be 0.5 μm to 1 μm, for example, 0.5 μm, 0.7 μm or 1 μm. An STI structure 11 is arranged between the second doped region 4 of the first conductive type and the third doped region 7 of the second conductive type, and a depth of the STI structure 11 is less than 0.3 μm. d is a distance between the first doped region 3 of the second conductive type and the first well region 166 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 14. For example, the first doped region 3 of the second conductive type, the first well region 15 of the first conductive type, and the deep well region 184 of the second conductive type jointly form a first BJT Q1; the second well region 84 of the first conductive type, the deep well region 184 of the second conductive type, and the substrate 1 of the first conductive type jointly form a second BJT Q2; the deep well region 184 of the second conductive type, the substrate 1 of the first conductive type, and the third doped region 7 of the second conductive type jointly form a third BJT Q3. A first resistance R1 is an equivalent resistance of the first well region 15 of the first conductive type, a second resistance R2 is an equivalent resistance of the deep well region 184 of the second conductive type, and a third resistance R3 is an equivalent resistance of the second well region 84 of the first conductive type.

Figure 15:
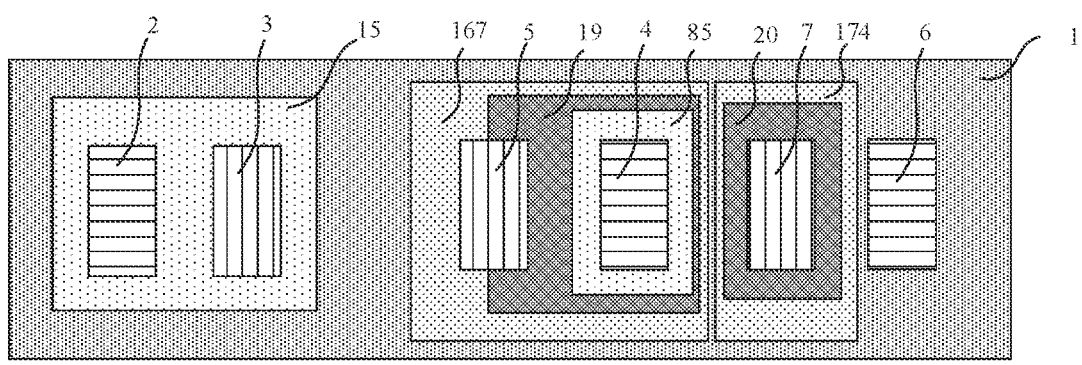
FIG. 15 is a top view of a latch-up test structure according to still another embodiment of the present disclosure.
Figure 16:
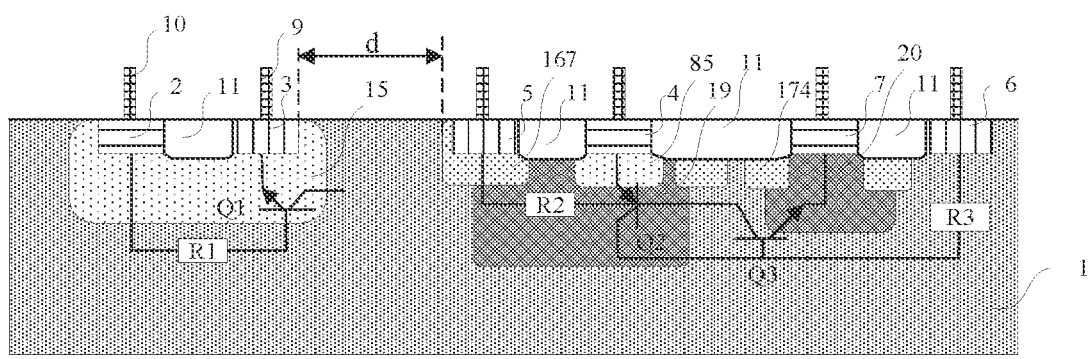
FIG. 16 is a schematic cross-sectional structural diagram of the latch-up test structure in FIG. 15.

In an embodiment, based on the embodiment shown in FIG. 1 and FIG. 2, as shown in FIG. 15 and FIG. 16, the latch-up test structure further includes: a first deep well region 19 of the second conductive type, located in the substrate 1 of the first conductive type; a second well region 85 of the first conductive type, located in the first deep well region 19 of the second conductive type, where the second doped region 4 of the first conductive type is located in the second well region 85 of the first conductive type; a first well region 167 of the second conductive type, located on a periphery of the first deep well region 19 of the second conductive type, where the second doped region 5 of the second conductive type is located in the first well region 167 of the second conductive type and between the second well region 85 of the first conductive type and the first well region 15 of the first conductive type; a second deep well region 20 of the second conductive type, located in the substrate 1 of the first conductive type and at a side, which is away from the first well region 15 of the first conductive type, of the first deep well region 19 of the second conductive type, and spaced apart from the first well region 167 of the second conductive type, where the second doped region 5 of the second conductive type is located in the second deep well region 20 of the second conductive type; and a second well region 174 of the second conductive type, located on a periphery of the second deep well region 20 of the second conductive type, and spaced apart from the first well region 167 of the second conductive type, where the third doped region of the first conductive type is located at a side, which is away from the first deep well region 19 of the second conductive type, of the second deep well region 20 of the second conductive type and spaced apart from the second well region 174 of the second conductive type.

The first well region 167 of the second conductive type is partially located in the first deep well region 19 of the second conductive type, and the second well region 174 of the second conductive type is partially located in the second deep well region 20 of the second conductive type. Further, the first well region 15 of the first conductive type, the first well region 167 of the second conductive type, the second well region 174 of the second conductive type, the second well region 85 of the first conductive type, the first deep well region 19 of the second conductive type, and the second deep well region 20 of the second conductive type are all lightly doped regions. Depths of the first well region 15 of the first conductive type, the first well region 167 of the second conductive type, the second well region 174 of the second conductive type, and the second well region 85 of the first conductive type may be 0.3 μm to 0.5 μm, for example, 0.3 μm, 0.4 μm or 0.5 μm. Depths of the first deep well region 19 of the second conductive type and the second deep well region 20 of the second conductive type may be 0.5 μm to 1 μm, for example, 0.5 μm, 0.7 μm or 1 μm. An STI structure 11 is arranged between the second doped region 4 of the first conductive type and the third doped region 7 of the second conductive type, and a depth of the STI structure 11 is less than 0.3 μm. d is a distance between the first doped region 3 of the second conductive type and the first well region 167 of the second conductive type.

When the first conductive type is a P type, and the second conductive type is an N type, a plurality of parasitic NPN BJTs or PNP BJTs are formed in the latch-up test structure. For equivalent circuits of some parasitic BJTs, reference may be made to FIG. 16. For example, the first doped region 3 of the second conductive type, the first well region 15 of the first conductive type, and the first deep well region 19 of the second conductive type jointly form a first BJT Q1;

the second well region 85 of the first conductive type, the first deep well region 19 of the second conductive type, and the substrate 1 of the first conductive type jointly for a second BJT Q2; the first deep well region 19 of the second conductive type, the second well region 85 of the first conductive type, and the second deep well region 20 of the second conductive type jointly form a third BJT Q3. A first resistance R1 is an equivalent resistance of the first well region 15 of the first conductive type, a second resistance R2 is an equivalent resistance of the first deep well region 19 of the second conductive type, and a third resistance R3 is an equivalent resistance of the second well region 85 of the first conductive type.

Parasitic NPN and PNP BJTs are formed in the latch-up test structure in the foregoing embodiments, which will cause a latch-up when an external voltage meets a certain condition, thus generating a latch-up effect. When the latch-up test structure is used for testing latch-up characteristics in the NI mode, the first electrode 9 may be connected to a common ground terminal VSS, and currents of different values are outputted from the latch-up test structure to the outside through the second electrode 10. For example, the current value may be 1 μA, 10 μA, 100 μA, or 1 mA. Then, the latch-up test structure is tested by using a Transmission Line Pulse (TLP), to obtain electrical parameters corresponding to latch-up characteristics of the current structure. The electrical parameters corresponding to the latch-up characteristics refer to a trigger voltage, a holding voltage, a trigger current, and a holding current of the latch-up test structure that are obtained according to an IV hysteresis characteristics curve of the latch-up test structure, where the hysteresis characteristics curve is obtained by testing with the TLP. With a higher trigger voltage, a latch-up effect is less likely to occur, and with a higher holding voltage, it is more difficult to maintain the latch-up effect. Assuming that a normal operating voltage is 1.1V, a trigger voltage of 1.2V corresponds to a higher risk of causing a latch-up effect, and a trigger voltage of 2V corresponds to a lower risk of causing a latch-up effect. Similarly, the same principle applies to the holding voltage. It should be noted that, the holding voltage is generally less than the trigger voltage.

In addition, the electrical parameters corresponding to the latch-up test structure may further be tested by adjusting the value of d, to avoid a latch-up effect in an integrated circuit having the latch-up test structure. Specifically, when the value of d decreases, external noise received by the latch-up test structure increases, and the holding voltage decrease. Therefore, a latch-up easier is more likely to occur. For example, when an output current of the latch-up test structure is 100 μA, a latch-up occurs if d is less than 50 nm. Therefore, during integrated circuit design, a design rule (DR) for d in the integrated circuit having the latch-up test structure requires d to be greater than 50 nm, to avoid a latch-up.

In the latch-up test structure, well regions and doped regions of different structure types are designed in the substrate of the first conductive type, to simulate possible latch-up structures in an integrated circuit, and these latch-up test structures can trigger a latch-up under certain external conditions. By testing related electrical parameters of the various possible latch-up structures in the integrated circuit and extracting rule parameters corresponding to various structures, design of the integrated circuit can be implemented and improved, to better ensure product reliability.

The technical characteristics of the above examples can be employed in arbitrary combinations. To provide a concise description of these examples, all possible combinations of all technical characteristics of the embodiment may not be described; however, these combinations of technical characteristics should be construed as disclosed in the description as long as no contradiction occurs.

Only several embodiments of the present disclosure are described in detail above, but they should not therefore be construed as limiting the scope of the present disclosure. It should be noted that those of ordinary skill in the art can further make variations and improvements without departing from the conception of the present disclosure. These variations and improvements all fall within the protection scope of the present disclosure. Therefore, the protection scope of the present disclosure should be subject to the protection scope defined by the claims.

The invention claimed is:

1. A latch-up test structure, comprising:
   a substrate of a first conductive type;
   a first well region of the first conductive type, located in the substrate of the first conductive type;
   a first doped region of the first conductive type, located in the first well region of the first conductive type;
   a first doped region of a second conductive type, located in the first well region of the first conductive type and spaced apart from the first doped region of the first conductive type; and
   a second doped region of the first conductive type, a second doped region of the second conductive type, a third doped region of the first conductive type, and a third doped region of the second conductive type that are arranged at intervals in the substrate of the first conductive type; wherein the second doped region of the first conductive type, the second doped region of the second conductive type, the third doped region of the first conductive type, and the third doped region of the second conductive type are all located at a side of the first doped region of the second conductive type away from the first doped region of the first conductive type; and the second doped region of the first conductive type, the second doped region of the second conductive type, the third doped region of the first conductive type, and the third doped region of the second conductive type are each spaced apart from the first well region of the first conductive type;

a first well region of the second conductive type, located in the substrate of the first conductive type; wherein the third doped region of the first conductive type and the third doped region of the second conductive type are both located in the first well region of the second conductive type, and the third doped region of the first conductive type is located between the third doped region of the second conductive type and the first well region of the first conductive type; the second doped region of the first conductive type is located between the first well region of the second conductive type and the first well region of the first conductive type, and is spaced apart from the first well region of the second conductive type and the first well region of the first conductive type; and a second well region of the second conductive type, located in the substrate of the first conductive type and between the first well region of the second conductive type and the second doped region of the first conductive type, and spaced apart from the first well region of the second conductive type and the second doped region of the first conductive type; wherein the second doped region of the second conductive type is located in the second well region of the second conductive type;

wherein a first electrode is provided on an upper surface of the first doped region of the second conductive type; and a second electrode is provided on an upper surface of the first doped region of the first conductive type; the first doped region of the second conductive type, the first well region of the first conductive type, and the second well region of the second conductive type jointly form a first bipolar junction transistor (BJT); the second well region of the second conductive type, the substrate of the first conductive type, and the first well region of the second conductive type jointly form a second BJT; and the third doped region of the first conductive type, the first well region of the second conductive type, and the substrate of the first conductive type jointly form a third BJT.

2. The latch-up test structure according to claim 1, further comprising: shallow trench isolation structures, wherein the shallow trench isolation structures are respectively located between the first doped region of the first conductive type and the first doped region of the second conductive type, between the second doped region of the first conductive type and the third doped region of the second conductive type, between the second doped region of the second conductive type and the third doped region of the second conductive type, and between the third doped region of the first conductive type and the third doped region of the second conductive type.

3. The latch-up test structure according to claim 1, wherein the first conductive type comprises a P type, and the second conductive type comprises an N type.

4. The latch-up test structure according to claim 1, wherein the first well region of the first conductive type is a lightly doped region, the first doped region of the first conductive type, the first doped region of the second conductive type, the second doped region of the first conductive type, the second doped region of the second conductive type, the third doped region of the first conductive type, and the third doped region of the second conductive type are all heavily doped regions.

* * * * *